United States Patent [19]
Farwell

[11] Patent Number: 5,642,364
[45] Date of Patent: Jun. 24, 1997

[54] CONTACTLESS TESTING OF INPUTS AND OUTPUTS OF INTEGRATED CIRCUITS

[75] Inventor: William D. Farwell, Thousand Oaks, Calif.

[73] Assignee: Hughes Electronics, Los Angeles, Calif.

[21] Appl. No.: 678,384

[22] Filed: Jun. 28, 1996

[51] Int. Cl.⁶ .................................................. G06F 11/00
[52] U.S. Cl. ...................... 371/28; 371/22.3; 395/183.06
[58] Field of Search ....................... 371/28, 22.1, 22.3, 371/22.5, 22.6; 395/183.06

[56] References Cited

U.S. PATENT DOCUMENTS

| | | | |
|---|---|---|---|
| 5,404,358 | 4/1995 | Russell | 371/22.3 |
| 5,544,309 | 8/1996 | Chang et al. | 395/183.06 |

*Primary Examiner*—Vincent P. Canney
*Attorney, Agent, or Firm*—Leonard A. Alkov; Wanda K. Denson-Low

[57] ABSTRACT

A test circuit for an integrated circuit by which electrical parameters of input/output (I/O) circuits of the integrated circuit are tested without direct electrical contact to the I/O, including a an output buffer Vdd supply bus (31) and an output buffer Vss return bus (32) for providing Vdd and Vss voltages for drivers of output buffers (41) of the I/O circuits of the integrated circuit; an interior logic Vdd supply bus (25) and an interior logic Vss return bus (26) for providing Vdd and Vss voltages for the interior logic (10) of the integrated circuit and the input buffers (45) of the I/O circuits; and a pull up Vdd supply bus (23) and a pull down Vss return bus (24) for providing Vdd and Vss voltages for the pull up sources (47) and the pull down sources (49) of the I/O circuits. Also disclosed is a self-shorting output buffer.

5 Claims, 2 Drawing Sheets

CONTACTLESS TESTING OF INPUTS AND OUTPUTS OF INTEGRATED CIRCUITS

BACKGROUND OF THE INVENTION

The disclosed invention is directed generally to test circuitry for integrated circuits, and more particularly to test circuitry that allow for electrical testing on input and/or output (I/O) circuits of integrated circuits without physically contacting each of the externally accessible I/O contact pads of the I/O circuits.

Integrated circuits include input circuits for receiving a input signals, and output circuits for delivering output signals. An input circuit is commonly implemented by an input buffer, while an output circuit is commonly implemented by an output driver. The inputs to input circuits such as input buffers are typically connected to associated contact pads, while the outputs of output circuits such as output drivers are connected to associated contact pads. An input circuit and an output circuit are sometimes combined to provide a bidirectional input/output (I/O) circuit wherein a single contact pad is connected to the input of the input circuit and to the output of the output circuit. For ease of reference, input circuits, output circuits, and bidirectional I/O circuits shall herein be called inputs, outputs, and bidirectional I/Os, respectively, and as I/O circuits or I/Os collectively. Also for ease of reference, the contact pads associated with the inputs, outputs, and bidirectional I/Os shall be called I/O contact pads, since input circuits, output circuits and bidirectional I/O circuits are connected to associated pads.

Integrated circuits are commonly tested with automatic test equipment (ATE) which typically provide respective probes for I/O contact pads of the integrated circuit being tested. Important considerations with known ATE testing include the possibility of probe damage to the I/O contact pads, complexity of test fixturing that must allow for all I/O contact pads to be directly contacted, limitations imposed on the number of I/O circuits due to the ATE capabilities as to the maximum number of I/O contact pads that can be contacted, ATE cost which is a direct function of the number of I/O pads to be contacted, and difficulty in testing integrated circuits at higher levels of assembly.

There are a number of techniques available to test the interior logic of digital IC's without contacting all the I/O pads. These include scan techniques by which tests are loaded and evaluated serially, and Built-in Self-Test (BIST) in which the chip tests itself on command. While these techniques can fully test the interior of a chip while using just a few I/O circuits, the remaining I/O circuits are not tested for DC electrical parameters such as the voltage and current drive characteristics of the outputs circuits, the logic threshold voltages of the input circuits, the leakage current of input circuits, and the leakage current of output circuits in the high impedance state.

The testing of I/O circuit DC electrical parameters has heretofore required direct probing from ATE of the I/O circuits. The invention provides a means of testing the electrical parameters of I/O without direct probing, and when used in addition to the aforementioned techniques, allows an integrated circuit to be fully tested by contacting only a few of the many possible I/O pads.

SUMMARY OF THE INVENTION

It would therefore be an advantage to provide for testing of the I/O circuits of integrated circuits without the need to contact or probe the I/O pads.

Another advantage would be to provide for testing of the I/O circuits of integrated circuits without imposing limitations on the number of I/O circuits.

A further advantage would be to provide for testing of an integrated circuit by probing contacts that are fewer in number than the I/O pads of the integrated circuit.

The foregoing and other advantages are provided by the invention in a test circuit that includes including a an output buffer Vdd supply bus and an output buffer Vss return bus for providing Vdd and Vss voltages for drivers of output buffers of the I/O circuits of an integrated circuit; an interior logic Vdd supply bus and an interior logic Vss return bus for providing Vdd and Vss voltages for the interior logic of the integrated circuit and the input buffers of the I/O circuits; and a pull up Vdd supply bus and a pull down Vss return bus for providing Vdd and Vss voltages for any pull up sources and pull down sources connected to the I/O circuits. A further aspect of the invention is directed to a self-shorting output buffer that includes an output stage comprised of a P-channel transistor and an N-channel transistor, and circuitry for selectively shorting the transistors simultaneously.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
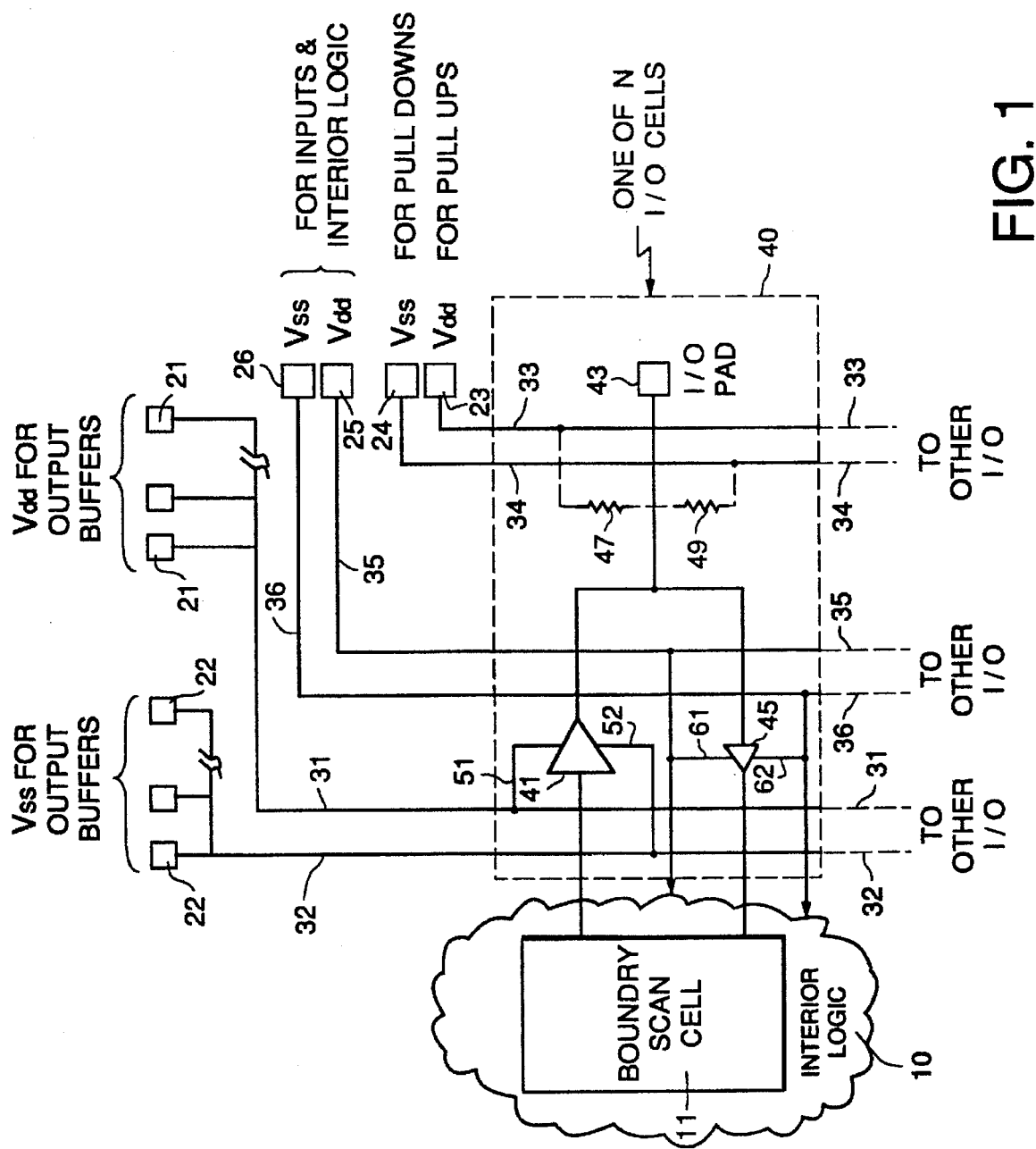
FIG. 1 is a schematic diagram of a test circuit structure in accordance with the invention.

In the following detailed description and in the several figures of the drawing, like elements are identified with like reference numerals.

The disclosed invention is based, in part, on separation of the power supply voltage sources among the various functions of a CMOS circuit. CMOS power supply voltages include a high voltage source commonly designated as Vdd, and a low voltage (typically 0 volts) return path commonly designated as Vss. These voltages can be referred to as supply rails, and a logical 1 is represented by a signal at the Vdd level, while a logical 0 is represented by a signal at the Vss level.

FIG. 1 schematically depicts test circuitry in accordance with the invention that is incorporated in an integrated circuit to allow testing of the electrical parameters of the I/O cells 40 of the integrated circuit without physically probing the contact pads associated therewith. The invention requires that every I/O cell to be tested be bidirectional for test purposes, even where an I/O is functionally used exclusively as an input or as an output. Further every I/O cell to be tested is fully controlled and monitored during test with boundary scan, for example in accordance with IEEE Standard 1149.1.

The test circuitry includes a plurality of output buffer Vdd supply contact pads 21 and a plurality of output buffer Vss return contact pads 22 for respectively receiving an output buffer supply voltage Vdd and an associated output buffer return Vss for the final or driver stages of output buffers of I/O cells 40, whereby the voltage across the output buffer supply contact pads 21 and the output buffer return contact pads 22 is Vdd-Vss. The output buffer Vdd supply contact pads 21 are electrically connected together to an output buffer supply bus 31, while the output buffer Vss return contact pads 22 are electrically connected together to an output buffer return bus 32.

The test circuitry further includes a pull up Vdd supply contact pad 23 and a pull down Vss return contact pad 24 for respectively receiving a pull up supply voltage Vdd and an associated pull down return Vss for any high impedance pull up and pull down resistors or current sources of the I/O cells 40. Pull ups and pull downs are commonly used to assure a known logic state on I/Os that are not being driven, and depending on the required circuit functionality, an I/O cell 40 can be connected to a pull up resistor or current source, a pull down resistor or current source, or neither. The pull up Vdd supply contact pad 23 is connected to a pull up supply bus 33, while the pull down Vss return contact pad 24 is connected to a pull down return bus 34. Pull ups and pull downs can be implemented as part of an I/O, or applied externally to an I/O, for example in the form of an external resistor. As is well known, an I/O is not connected to both a pull up and a pull down.

Further supply isolation is provided by an interior logic Vdd supply contact pad 25 and an interior logic Vss return contact pad 26 for respectively receiving an interior logic supply voltage Vdd and an associated interior logic return Vss for the input buffers of the I/O cells 40, the pre-drive circuits of the output buffers of the I/O cells 40, and for the interior logic 10 of the integrated circuit in which the I/O circuitry of the invention implemented. The interior logic Vdd supply contact pad 25 is connected an interior logic supply bus 35, while the interior logic Vss return contact pad is connected to an interior logic return bus 36.

Each I/O cell 40 includes an output buffer 41 having an input connected to an associated boundary scan cell 11 of interior logic 10 of the integrated circuit, an input connected to an I/O pad 43 of the I/O cell 40, and first and second final stage supply nodes 51, 52 respectively connected to the output buffer supply bus 31 and the output buffer return bus 32. An input buffer 45 includes an input connected to the I/O pad 43, an output connected to the associated boundary scan cell 11 of the interior logic 10, and first and second supply nodes 61, 62 respectively connected to the interior logic supply bus 35 and the interior logic return bus 36. To the extent that a pull up or a pull down is included in the I/O cell, a pull up resistor or current source 47 would be connected between the pull up supply bus 34 and the I/O pad 43, or a pull down resistor or current source 49 would be connected between the pull down return bus 34 and the I/O pad 43.

Figure 2:
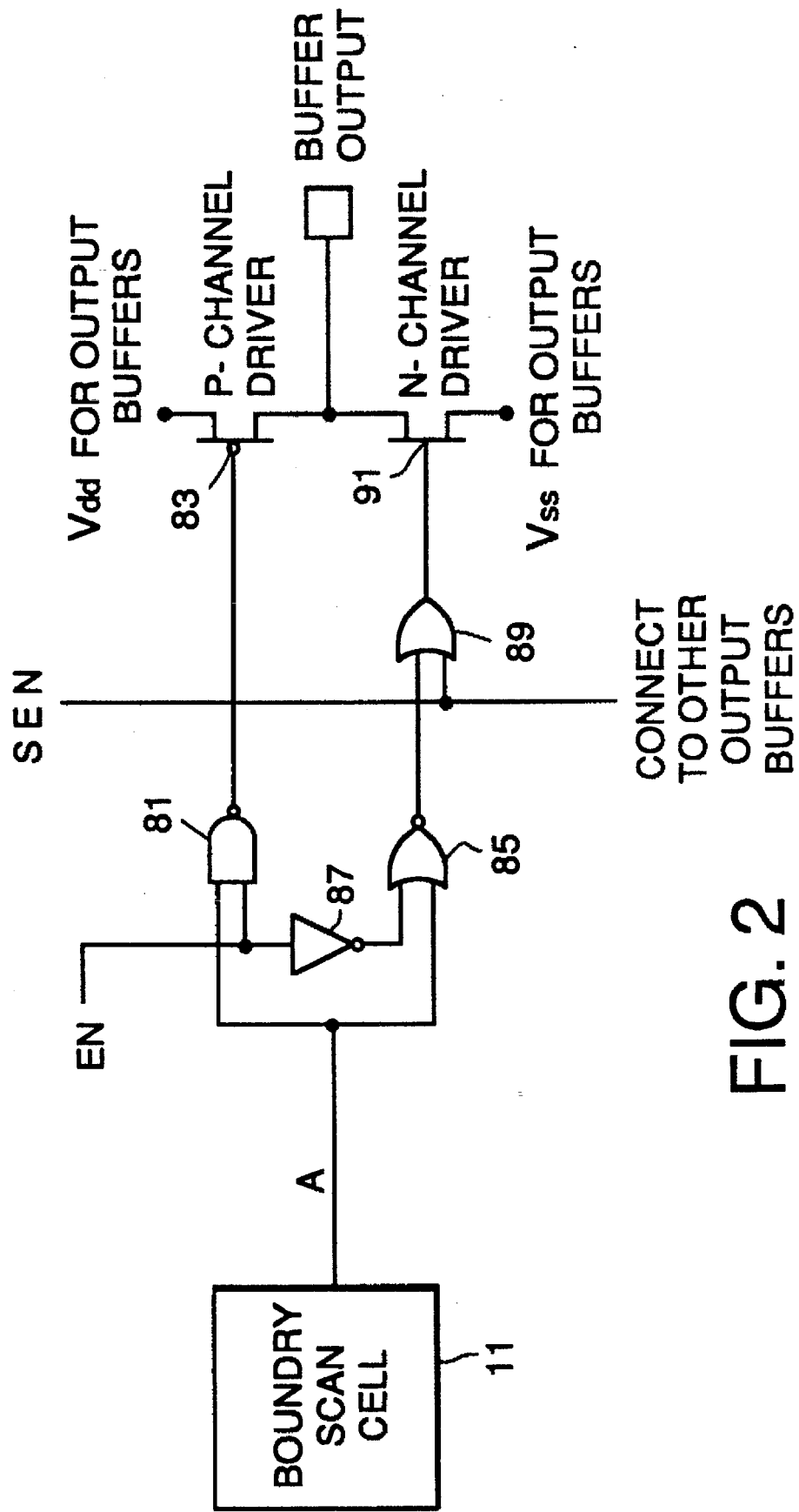
FIG. 2 is a schematic diagram of a self shorting output buffer that can be utilized in the test circuit structure of FIG. 1.

Referring now to FIG. 2, schematically depicted therein is a self-shorting output buffer in accordance with the invention which can be utilized in the test circuit of FIG. 1 to allow the output buffer drive testing technique of the invention described further herein. The self-shorting output buffer includes a NAND gate 81 which has one input connected to the associated boundary scan cell 11 for receiving an input A to the input buffer, and another input for receiving a buffer enable signal EN. The output of the NAND gate 81 is provided to the gate of a P-channel driver 83 which has a source that is connected to the output buffer supply voltage Vdd via the output buffer supply bus 31. A NOR gate 85 has one input connected the associated boundary scan cell 11 for receiving the input A to the input buffer, and another input for receiving the inverse of the buffer enable signal EN as provided by an inverter 87. The output of the NOR gate 85 is provided to an OR gate 89 which also receives as another input a short mode enable signal SEN that is further provided to other self-shorting output buffers in the integrated circuit in which the output buffer of FIG. 2 is implemented. The output of the OR gate is provided to the gate of an N-channel driver 91 which has a source that is connected to the output buffer return voltage via the output buffer return bus 33. The drain of the P-channel driver 83 and the drain of the N-channel driver 91 are connected together to provide the output of the buffer.

The following table sets forth the states of the components of the output buffer of FIG. 2 as a function of the input signal A, the enable signal EN, and the short enable signal SEN.

| SEN | EN | A | NAND | NOR | OR | P | N | OUTPUT |
|---|---|---|---|---|---|---|---|---|
| 0 | 1 | 0 | 1 | 1 | 1 | OFF | ON | 0 |
| 0 | 1 | 1 | 0 | 0 | 0 | ON | OFF | 1 |
| 0 | 0 | X | 1 | 0 | 0 | OFF | OFF | Z |
| 1 | 1 | 0 | 1 | 1 | 1 | OFF | ON | 0 |
| 1 | 1 | 1 | 0 | 0 | 1 | ON | ON | IN-DETER-MINATE |
| 1 | 0 | X | 1 | 0 | 1 | OFF | ON | 0 |

Thus, for the normal mode of operation, the short enable signal SEN is set to 0 and the enable signal EN is set to 1. For the high impedance state, the short mode enable signal SEN is set to 0 and the enable signal EN is set to 0. For the shorting mode of operation wherein the output drivers are shorted (i.e., both are conductive), the short enable signal SEN is set to 1 and the enable signal EN is set to 1.

The circuits of FIGS. 1 and 2 can be utilized in conjunction with automatic test equipment (ATE) to perform the following DC parametric tests, wherein the ATE would perform the indicated current measurements.

INPUT THRESHOLD TESTING SEQUENCE

Set-up

1. Set the Vss/Vdd of the input buffers (and of the interior logic) to normal operational levels.

High Level Threshold Test

2. Set the Vss of the output buffers to normal operational level.
3. Set the Vdd of the output buffers to the high level threshold voltage to be tested.
4. Using boundary scan, cause each output driver to make a 0-1-0 transition sequence. Observe that the respective input buffers also make a 0-1-0 transition, using boundary scan or an input parametric tree. This verifies the high level threshold voltage of input buffers.

Low Level Threshold Test

5. Set the Vdd of the output of the output buffers to the normal operational level.
6. Set the Vss of the output buffers to the low level threshold voltage to be tested.
7. Cause each output driver to make a 1-0-1 transition sequence (using boundary scan). Observe that the respective inputs also make a 1-0-1 transition (using boundary scan or an input parametric tree). This verified the low level threshold voltage of input buffers.

PULL UP AND PULL DOWN CURRENT TESTING SEQUENCE (For I/O Having Either A Pull Up Or A Pull Down)

Set-Up

1. Set the Vss/Vdd of the input buffers (and of the interior logic) to normal operational levels.

2. Set the Vss/Vdd of the output buffers to normal operational levels.
3. Set the pull up Vdd equal to output Vdd. Set the pull down Vss equal to output Vss.
4. Set all I/O to the minimum quiescent current state. For example, I/O having pull ups are set to logical 1, while I/O having pull downs are set to logical 0. I/O having neither a pull up or a pull down may be set to either a logical 1 or a logical 0.

Measurement

5. One at a time, set each output having a pull up to logical 0. Measure the current at the pull up Vdd, which is the pull up current of the output under test.
6. One at a time, set each output having a pull down to logical 1. Measure the current at the pull down Vss, which is the pull down current of the output under test.

OUTPUT BUFFER DISABLE (HIGH IMPEDANCE) TESTING SEQUENCE

Set-Up

1. Set the Vss/Vdd of the outputs, inputs (and interior logic) to normal operational levels.

Low Drive (N-Channel) Disable Test

2. Set both the pull up Vdd and the pull down Vss to the voltage level of the output Vdd, which inhibits pull down on all of the I/O having pull downs.
3. Enable and drive the output(s) under test to logical 1.
4. Disable output(s) under test (set to Z with boundary scan or global disable). An output thus disabled will remain at logical 1 as a result of precharging of its capacitance to that state in the prior step.
6. Set input to output driver of output(s) under test to logical 0, keeping the output disabled.
7. Immediately read the value at the respective input buffer (using boundary scan). It should be a logical 1. A logical 0 indicates that the N-channel transistor of the output buffer failed to disable.

High Drive (P-Channel) Disable Test.

8. Set both the pull up Vdd and the pull down Vss to the voltage level of the output Vss.
9. Enable and drive the output(s) under test to logical 0.
10. Disable output(s) under test (set Z with boundary scan or global disable signal). An output thus disabled will remain at logical 0 as a result of precharging of its capacitance to that state in the previous state.
11. Set the input to the output driver of the output(s) under test to logical 1, keeping the output disabled (with boundary scan).
12. Immediately read the value at the respective input buffer (with boundary scan). It should be a logical 0.

OUTPUT DRIVE TESTING

Set-Up

1. Set all Vss/Vdd to specified levels.
2. Set all outputs to logical 0 with boundary scan.
3. Set short mode enable signal SEN (FIG. 2) to logical 1.

4. One at a time, set each output-under-test to a logical 1 with boundary scan. All other outputs remain at logical 0.
5. Measure the current at the Vdd or Vss of the output buffers. It will be the short circuit current, through the P-N transistor pair, of the output-under-test. This measurement correlates with drive capability, and may be used to screen for output-too-weak and output-too-strong.

The foregoing has thus been a disclosure of test circuitry that allows for testing the I/O cells of integrated circuits without the need to contact or probe the I/O pads of the I/O cells, and which does not impose limitations on the number of I/O circuits that can be tested. The test circuitry further allows for testing a higher levels of assembly if the described Vdd/Vss isolation is maintained, which may be further desirable for noise control purposes. The foregoing has also disclosed a self shorting output buffer which allows the output drivers to be turned on simultaneously. This provides for momentary application of a large, short circuit current through the output driver of each output buffer, one buffer at a time, which can be measured at the independent output buffer supply and return contact pads. This advantageously avoids the need of connecting a low impedance load to an I/O pad, and also avoids the measurement error of a resistive voltage drop caused by measuring a high short circuit current through a single I/O pad since the short circuit is entirely internal and the current supplied is through multiple output buffer supply pads and multiple output buffer return pads. Since there are multiple output buffer supply pads and multiple output buffer return pads, one may be used to connect a Kelvin voltage probe. Thus, accurate voltage measurements are possible on the individual output drivers during the high current test.

Although the foregoing has been a description and illustration of specific embodiments of the invention, various modifications and changes thereto can be made by persons skilled in the art without departing from the scope and spirit of the invention as defined by the following claims.

What is claimed is:

1. A test circuit for an integrated circuit having interior logic that includes boundary scan cells, comprising:
   a plurality of input/output (I/O) circuits, each I/O circuit including an output buffer having an output driver, an input buffer, and a contact pad;
   an output buffer Vdd supply bus and an output buffer Vss return bus for providing Vdd and Vss voltages for the drivers of the output buffers of the I/O circuits;
   an interior logic Vdd supply bus and an interior logic Vss return bus for providing Vdd and Vss voltages for the interior logic of the integrated circuit and the input buffers of the I/O circuits; and
   means for selectively disabling pull up sources and pull down sources connected to the I/O circuits.

2. The test circuit of claim 1 wherein said means for selectively disabling includes a pull up Vdd supply bus and a pull down Vss return bus for providing Vdd and Vss voltages for pull up sources and pull down sources connected to the I/O circuits.

3. The test circuit of claim 1 further including test contact pads connected to said output buffer Vdd supply bus and said output buffer Vss return bus for allowing voltage and current measurements.

4. The test circuit of claim 1 wherein one or more of the output buffers of the I/O circuits is comprised of:
   a NAND gate having a first input for receiving the input logic signal, a second input for receiving a buffer enable signal, and an output for providing a NAND gate output;

a P-channel driver having a gate connected to said NAND gate output, a source connected to a first supply voltage, and a drain connected to an output node;

a NOR gate having a first input for receiving the input logic signal, a second input for receiving a logical inverse of the buffer enable signal, and an output for providing a NOR gate output;

an OR gate having a first input connected to the output of said NOR gate, a second input for receiving a short mode enable signal, and an output for providing an OR gate output; and an N-channel driver having a gate connected to the output of said OR gate, a source connected to a second supply voltage, and a drain connected to said output node;

wherein a short mode of operation is enabled when the input logic input is a logical high and said short enable signal is a logical high.

5. An output buffer circuit for receiving an input logic signal, comprising:

a NAND gate having a first input for receiving the input logic signal, a second input for receiving a buffer enable signal, and an output for providing a NAND gate output;

a P-channel driver having a gate connected to said NAND gate output, a source connected to a first supply voltage, and a drain connected to an output node;

a NOR gate having a first input for receiving the input logic signal, a second input for receiving a logical inverse of the buffer enable signal, and an output for providing a NOR gate output;

an OR gate a first input connected to the output of said NOR gate, a second input for receiving a short mode enable signal, and an output for providing an OR gate output; and an N-channel driver having a gate connected to the output of said OR gate, a source connected to a second supply voltage, and a drain connected to said output node;

wherein a short mode of operation is enabled when the input logic input is a logical high and said short enable signal is a logical high.

* * * * *